(12) United States Patent
Brainard et al.

(10) Patent No.: US 9,054,238 B1
(45) Date of Patent: Jun. 9, 2015

(54) SEMICONDUCTOR WITH SILVER PATTERNS HAVING PATTERN SEGMENTS

(71) Applicant: GTAT Corporation, Merrimack, NH (US)

(72) Inventors: Robert Brainard, Sunnyvale, CA (US); Gopal Prabhu, San Jose, CA (US); David Tanner, San Jose, CA (US); Dong Xu, Fremont, CA (US)

(73) Assignee: GTAT Corporation, Merrimack, NH (US)

( * ) Notice: Subject to any disclaimer, the term of this patent is extended or adjusted under 35 U.S.C. 154(b) by 0 days.

(21) Appl. No.: 14/191,234

(22) Filed: Feb. 26, 2014

(51) Int. Cl.
*H01L 21/00* (2006.01)
*H01L 29/06* (2006.01)
*H01L 31/0224* (2006.01)
*C25D 1/00* (2006.01)

(52) U.S. Cl.
CPC .......... *H01L 31/022425* (2013.01); *C25D 1/00* (2013.01)

(58) Field of Classification Search
CPC ... H01L 31/022425; H01L 31/18; C25D 1/00
USPC ............................................. 438/57; 257/618
See application file for complete search history.

(56) References Cited

U.S. PATENT DOCUMENTS

| 5,620,528 A | 4/1997 | Schade et al. |
| 8,066,840 B2 | 11/2011 | Narasimhan et al. |
| 2004/0187911 A1 | 9/2004 | Gaudiana et al. |
| 2007/0144577 A1 | 6/2007 | Rubin et al. |
| 2010/0000602 A1 | 1/2010 | Gray et al. |
| 2010/0032014 A1 | 2/2010 | Bettinelli et al. |
| 2011/0023952 A1 | 2/2011 | Williams et al. |
| 2011/0277835 A1 | 11/2011 | Masson et al. |
| 2012/0060895 A1 | 3/2012 | Rubin et al. |
| 2012/0174806 A1 | 7/2012 | Spoor et al. |
| 2012/0308476 A1 * | 12/2012 | Kim et al. ...................... 423/610 |
| 2013/0291743 A1 | 11/2013 | Endo et al. |

FOREIGN PATENT DOCUMENTS

| WO | WO 2008080160 A1 * | 7/2008 | .............. H01L 31/05 |
| WO | WO 2009032021 A2 * | 3/2009 | .............. C23C 14/00 |
| WO | 2009130164 A | 10/2009 | |
| WO | 2013090562 A | 6/2013 | |

* cited by examiner

*Primary Examiner* — David S Blum
(74) *Attorney, Agent, or Firm* — The Mueller Law Office, P.C.

(57) ABSTRACT

A photovoltaic cell and method of forming the cell includes providing an electroformed metallic article having a plurality of electroformed elements that form a free-standing, unitary piece. The metallic article has gridlines that are spaced apart at a pitch $P_M$. A semiconductor substrate has a top surface with a plurality of silver, where at least one of the silver patterns comprises pattern segments spaced apart at a pitch $P_S$. The pattern segments have a length $L_S$ defined by the equation $L_S = P_M - k*P_S/2$, k being a value from 1.0 to 1.4. The metallic article is coupled to the semiconductor substrate, in which a first electroformed element in the plurality of electroformed elements is coupled to a first silver pattern in the plurality of silver patterns.

28 Claims, 8 Drawing Sheets

SEMICONDUCTOR WITH SILVER PATTERNS HAVING PATTERN SEGMENTS

BACKGROUND OF THE INVENTION

A solar cell is a device that converts photons into electrical energy. The electrical energy produced by the cell is collected through electrical contacts coupled to the semiconductor material, and is routed through interconnections with other photovoltaic cells in a module. The "standard cell" model of a solar cell has a semiconductor material, used to absorb the incoming solar energy and convert it to electrical energy, placed below an anti-reflective coating (ARC) layer, and above a metal backsheet. Electrical contact is typically made to the semiconductor surface with fire-through paste, which is metal paste that is heated such that the paste diffuses through the ARC layer and contacts the surface of the cell. The paste is generally patterned into a set of fingers and bus bars which will then be soldered with ribbon to other cells to create a module. Another type of solar cell has a semiconductor material sandwiched between transparent conductive oxide layers (TCO's), which are then coated with a final layer of conductive paste that is also configured in a finger/bus bar pattern.

In both these types of cells, the metal paste, which is typically silver, works to enable current flow in the horizontal direction (parallel to the cell surface), allowing connections between the solar cells to be made towards the creation of a module. Solar cell metallization is most commonly done by screen printing a silver paste onto the cell, curing the paste, and then soldering ribbon across the screen printed bus bars. However, silver is expensive relative to other components of a solar cell, and can contribute a high percentage of the overall cost.

SUMMARY OF THE INVENTION

A photovoltaic cell and method of forming the cell includes providing an electroformed metallic article having a plurality of electroformed elements that form a free-standing, unitary piece. The metallic article has gridlines that are spaced apart at a pitch $P_M$. A semiconductor substrate has a top surface with a plurality of silver, where at least one of the silver patterns comprises pattern segments spaced apart at a pitch $P_S$. The pattern segments have a length $L_S$ defined by the equation $L_S = P_M - k \cdot P_S/2$, k being a value from 1.0 to 1.4. The metallic article is coupled to the semiconductor substrate, in which a first electroformed element in the plurality of electroformed elements is coupled to a first silver pattern in the plurality of silver patterns.

BRIEF DESCRIPTION OF THE DRAWINGS

Each of the aspects and embodiments of the invention described herein can be used alone or in combination with one another. The aspects and embodiments will now be described with reference to the attached drawings.

DETAILED DESCRIPTION OF THE EMBODIMENTS

Metallization of solar cells is conventionally achieved with screen-printed silver patterns on the surface of the cell, and with cell-to-cell interconnections that utilize solder-coated ribbons. The silver patterns play the primary current collection role for the solar cell, with the silver patterns including fingers to collect current from the surface of the semiconductor, and bus bars to gather current from the fingers. However, the amount of silver that is required to meet the electrical current capacity of the cell can contribute a significant percentage to the cost of the solar cell. In the present disclosure, the amount of silver for a solar cell is greatly reduced, such as by approximately 50%-90%, through silver patterns that are tailored for use with a free-standing metallic article. The silver patterns may have smaller dimensions in height, width, and/or length compared to conventional silver patterns. The silver patterns can also be designed with solder pads that ensure durability of solder joints while limiting the amount of silver for the solder pads.

Figure 1:
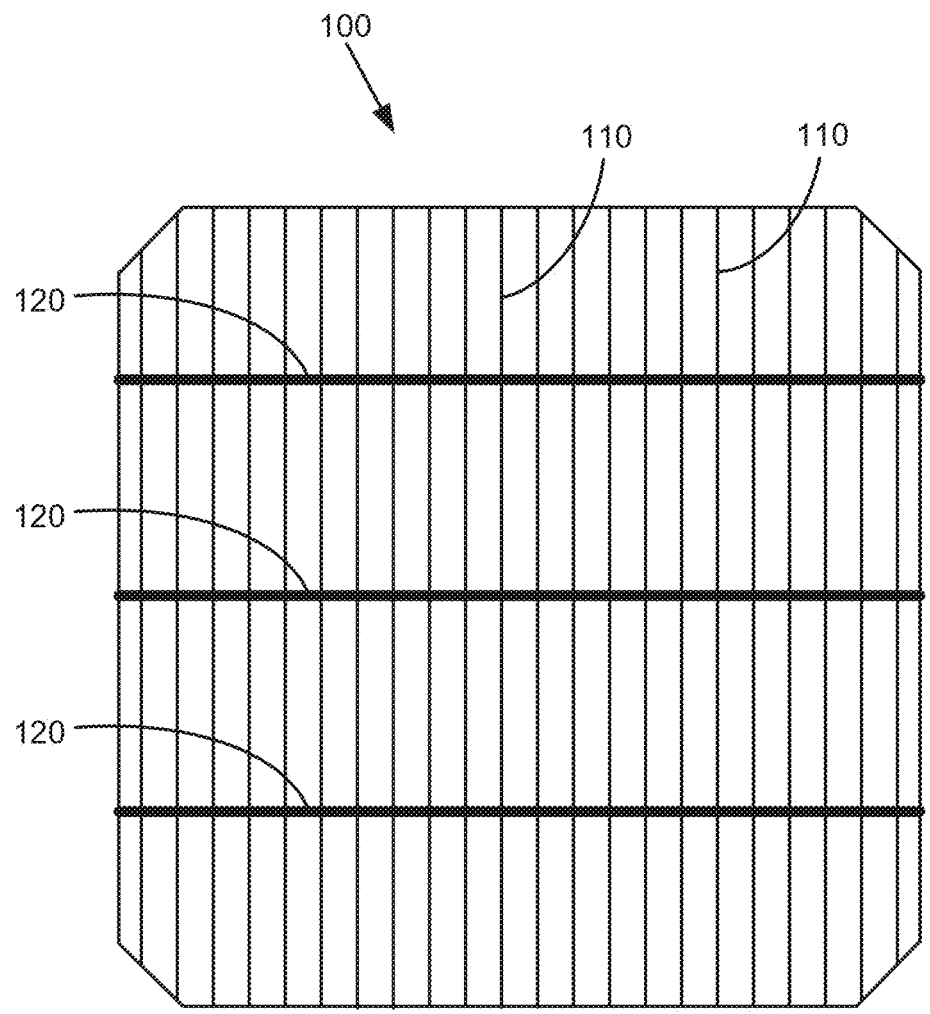
FIG. 1 shows a top view of conventional silver patterns for a solar cell.

FIG. 1 is a top view of a conventional solar cell 100, with silver fingers 110 and bus bars 120. Silver fingers 110 extend across the entire length of cell 100, and collect current from the surrounding semiconductor area on either side of each finger 110. Typical cells have 60-90 narrow fingers 110 that collect the cell current from a local area. Bus bars 120 serve as a conduit to aggregate the current from the fingers 110. Conventional cells have two or three bus bars 120, each being on the order of 1.5-2 mm wide, to allow for a copper bus bar (not shown) to be soldered to the cell. Copper bus bars collect the total current from the cell and enable interconnections between cells within a photovoltaic module. For conventional solar cells, the front side screen-printed silver for the fingers 110 and bus bars 120 requires about 150-200 mg of silver paste.

The conventional cell 100 requires copper ribbons to be soldered to the bus bars 120 to enable the current from the entire cell to be collected, since the silver bus bars 120 without the copper ribbon are too resistive. In designing conventional silver patterns, the current densities for mono- and multi-silicon are fixed, and consequently the cross-sectional area of the silver fingers 110 is fixed. At the same time, it is desirable to reduce the area occupied by the metal contacts (fingers 110 and bus bars 120) so that the active area of the photovoltaic cell can be increased (i.e., shadowing is reduced). However, any reduction in the metal contact area will increase the cell current, due to the increase in active area. Reducing the contact area is usually achieved by reducing the width of the fingers, but since the silver amount is fixed by the total current that must be carried by the silver, reducing the width of the fingers requires the thickness of the fingers to be increased. For example, conventional fingers are 80 μm wide and 20 μm thick, but reducing the fingers to 50 μm wide would require the thickness to be increased to about 30 μm. In this disclosure the thickness of a silver pattern shall refer to the height of the silver relative to the surface of the cell.

Figure 2:
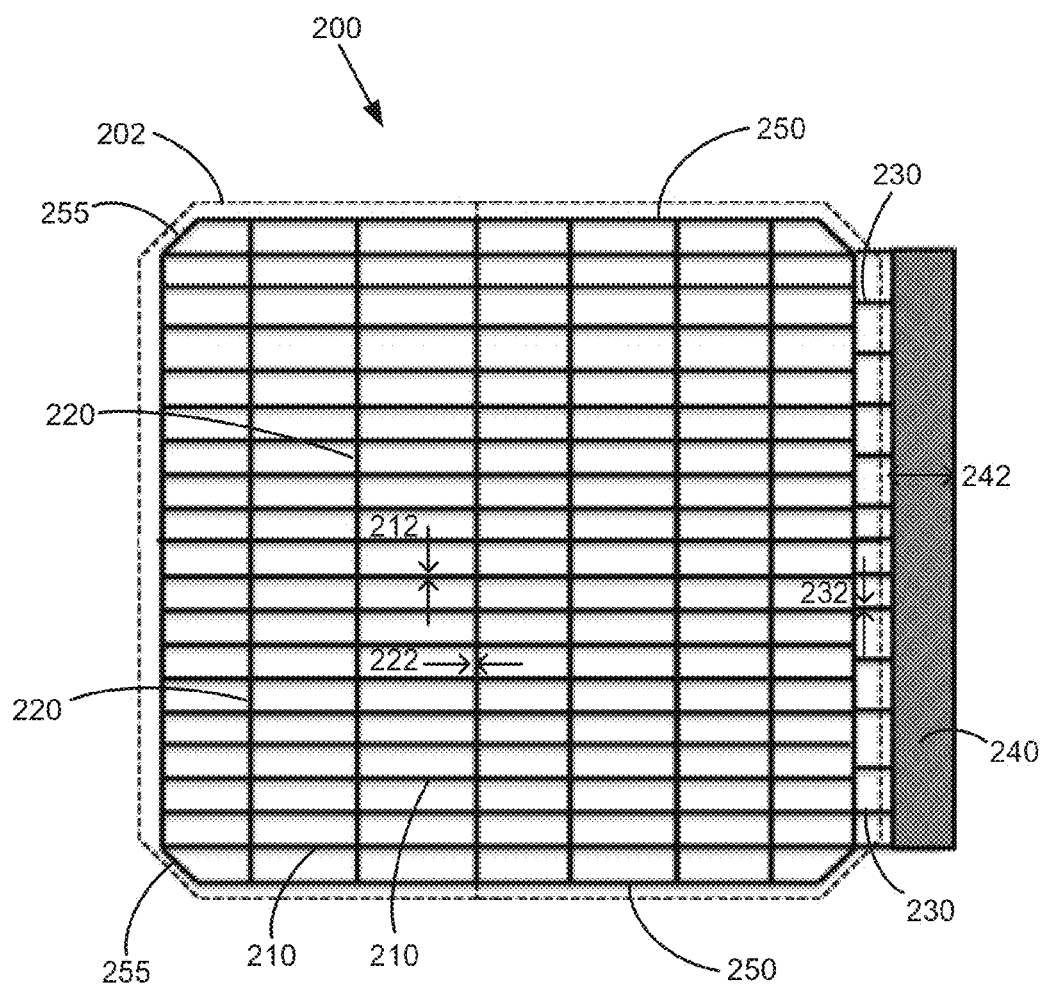
FIG. 2 is a top view of an embodiment of a metallic article.

In another approach for fabricating solar cells, free-standing metallic articles that are made of, for example, copper, are used as the primary electrical conduit for a solar cell instead of silver fingers. FIG. 2 illustrates a top view of an exemplary metallic article 200 as disclosed in Babayan et al., U.S. patent application Ser. No. 14/079,540 entitled "Adaptable Free-Standing Metallic Article For Semiconductors" and filed on Nov. 13, 2013; which is owned by the assignee of the present disclosure and is hereby incorporated by reference. The metallic article 200 is produced separately from a solar cell and can include multiple elements such as gridlines that can be transferred stably as a unitary piece and easily aligned to a semiconductor device. The metallic article may be manufactured by, for example, electroforming on an electrically conductive mandrel. The gridlines of metallic article 200—such as bus bars 210 and fingers 220—may be designed with height-to-width aspect ratios that minimize shading for a solar cell. The metallic article 200 can replace conventional bus bar metallization and ribbon stringing for cell metallization, cell-to-cell interconnection and module fabrication. A benefit of utilizing the free-standing metallic article 200 is that the amount of silver may be reduced as a result of the metallic article carrying a large amount of the current for the solar cell.

The metallic article 200 of FIG. 2 shows embodiments of various features adapted for a photovoltaic cell. A semiconductor substrate 202 is shown in dashed lines to demonstrate the placement of metallic article on a photovoltaic cell, where the metallic article 200 is configured here as a grid for the front side of the cell. However, the features described herein may be applied to an electrical conduit for the back side of a photovoltaic cell. In this disclosure, reference to semiconductor materials in formation of a semiconductor device or photovoltaic cell may include amorphous silicon, crystalline silicon or any other semiconductor material suitable for use in a photovoltaic cell. The metallic articles may be also applied to types of semiconductor devices other than photovoltaic cells. Semiconductor substrate 202 is shown in FIG. 2 as a monocrystalline cell with rounded corners, also referred to as a pseudosquare shape. In other embodiments, the semiconductor substrate may be multi-crystalline, with a fully square shape. Semiconductor substrate 202 may have electrical conduit lines such as silver patterns (not shown) on its surface that carry current generated by substrate 202. The silver fingers may be screen-printed onto the semiconductor substrate 202. For example, the silver fingers may be lines that are perpendicular to the direction of gridlines 210. The elements of metallic article 200 then serve as electrical conduits to carry electrical current from the silver fingers. In this embodiment of FIG. 2, gridline lines 210 (horizontal in FIG. 2) and 220 (vertical in FIG. 2) of metallic article 200 are electrically coupled to the semiconductor substrate 202, such as by soldering, to collect and deliver the current to interconnection elements 230 and 240. Interconnection elements enable cell-to-cell connections for a solar module. Fabricating metallic article 200 with a metal such as copper reduces the cost compared to a cell in which silver is used for all the electrical conduits, and can also improve cell efficiency due to improved conductivity.

The gridline lines 210 and 220 of FIG. 2 are shown as approximately perpendicular to each other; however, in other embodiments they may be at non-perpendicular angles to each other. Although both the gridline lines 210 and intersecting gridline lines 220 are capable of carrying electrical current, gridline lines 210 provide the path of least resistance to interconnection elements 230 and 240 and would function as the primary carriers of electrical current. Thus, in this disclosure gridline lines 210 shall also be referred to as bus bars, while the intersecting gridline lines 220 may be referred to as cross members or support members. Cross members 220 provide mechanical support for the free-standing metallic article 200, both in terms of strength and in maintaining dimensional specifications of the grid. However, cross members 220 can also serve as electrical conduits, such as in providing redundancy if a bus bar 210 should fail. In some embodiments, gridline lines 210 and 220 may have widths 212 and 222, respectively, that differ from each other such as to optimize mechanical strength or achieve a desired fill factor for the cell. For example, width 212 of gridline lines 210 may be smaller than width 222 of gridline lines 220, so that gridline lines 220 provide sufficient mechanical stability for metallic article 200 while gridline lines 210 are tailored to achieve as high a fill factor as possible. In other embodiments, width 212 of bus bars 210 may be greater than width 222 of the support members 220, to achieve the electrical capacity needed for a certain number of bus bars 210. In further embodiments, certain gridline lines 210 may have different widths than other gridline lines 210, such as to address mechanical strength or electrical capacity of a particular zone. The pitch of bus bars 210 may also vary from the cross members 220, or may vary from each other in different regions within metallic article 200 to meet required device conduction requirements. In some embodiments, a coarser or finer mesh pitch may be chosen based on, for example, the silver finger designs of the wafer, the precision of the silver screen printing process, or the type of cell being used.

Gridlines 210 and 220 also include edge members 250 and 255, which are configured to be located near the perimeter of a solar cell. For instance, the edge members 250 and 255 may be located 1-3 mm from the edges of the wafer 202. Because edge members 250 and 255 form the perimeter of metallic article 200, edge members 250 and 255 may be wider than other gridlines 210 and 220 in the interior of metallic article 200, to provide additional structural support. Edge members 255 are configured as corner bus bars in the embodiment of FIG. 2, that form an angle from the main edge member 250. That is, edge member 250 has a change in conduit direction along the length, such as to accommodate a pseudosquare shape in this embodiment. This change in direction can be integrally formed by the electroforming method using a conductive mandrel, and can include tailoring the width of the corner bus bar 255 for improving mechanical strength and reducing resistive losses. Wider gridlines 250 and 255 at the perimeter of metallic article 200 can also improve the bonding strength when attaching the metallic article 200 to the semiconductor substrate 202.

Figure 3:
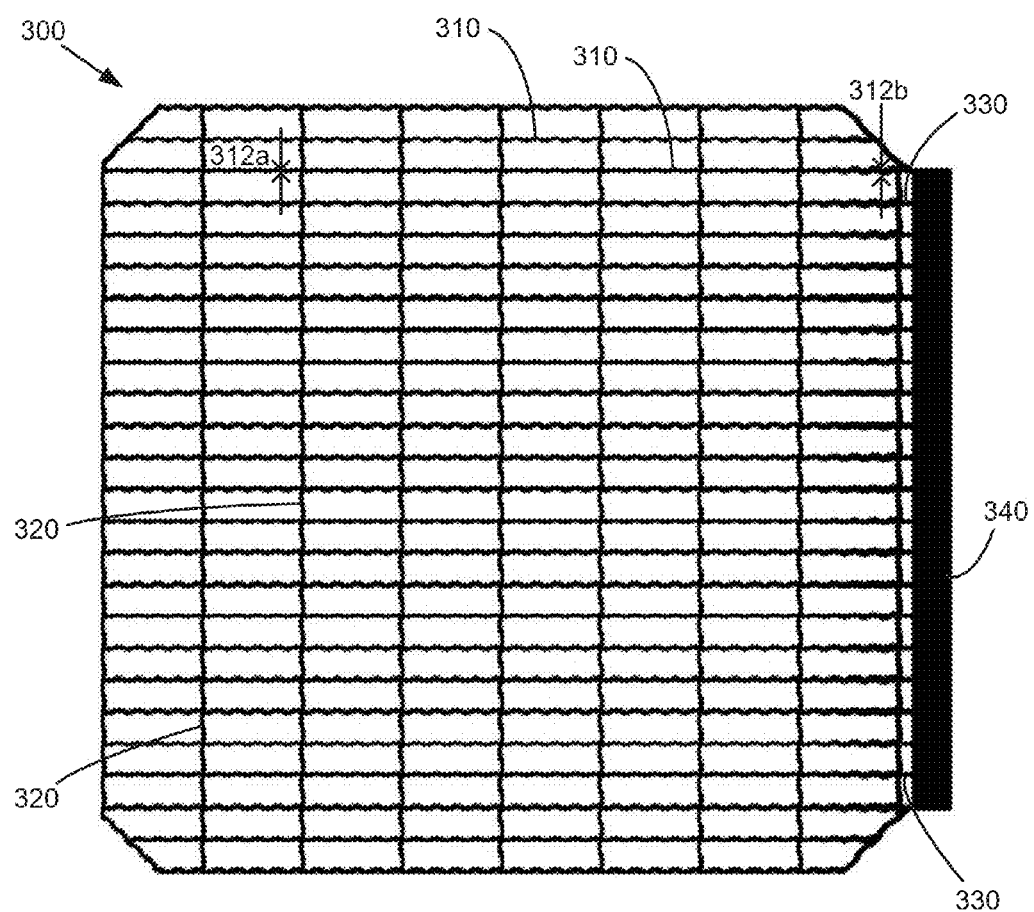
FIG. 3 provides a top view of a metallic article with adaptable features, in one embodiment.

FIG. 3 shows a top view of an embodiment of another metallic article 300 as disclosed in U.S. patent application Ser. No. 14/079,540. Metallic article 300 has intersecting gridlines 310 and 320 forming a mesh configuration over the majority of the metallic article 300, with interconnecting elements 330 and 340 at one end of the mesh. Gridlines 310 have a width that is non-uniform along its length, with the non-uniform width being designed into the electroforming mandrel in which metallic article 300 is fabricated. In the embodiment of FIG. 3, width 312a is smaller than width 312b nearer the interconnect element 340, which is the current collection end of the cell. This increased width 312b accommodates the higher electrical current at this end, as current is gathered by the metallic article across its surface. Thus the increased width 312b reduces resistive losses. The height (i.e., thickness) of the gridline 310 may also be adjusted as desired in the areas of increased width, as described previously.

The gridlines 310 and 320 show another designed feature of metallic article 300, in that the lengthwise profile can be altered in shape in addition to varying in width. In FIG. 3, the gridlines 310 and 320 are configured with a non-linear pattern that allows the gridlines to expand lengthwise, thus serving as an expansion segment. The patterns may be fabricated by, for example, an electroforming mandrel in which metallic article 300 is created. In the embodiment of FIG. 3, the both gridlines 310 and 320 have a wave-type pattern, oriented parallel to the plane of the metallic article 300 so that the metallic article presents a flat surface for joining to a photovoltaic cell. The wave pattern may be configured as, for example, a sine-wave or other curved shape or geometries. The wave pattern provides extra length between solder points to allow the metallic article 300 to expand and contract, such as to provide strain relief for differences in coefficients of thermal expansion (CTE) between metallic article and the semiconductor substrate to which it is joined.

Other examples of free-standing, unitary metallic articles that may be used with the present disclosure are disclosed in Babayan et al., U.S. Pat. No. 8,569,096, entitled "Free-Standing Metallic Article for Semiconductors" and issued on Oct. 29, 2013, which is owned by the assignee of the present disclosure and is incorporated by reference herein. Additional metallic articles may have overplated portions, as disclosed in U.S. patent application Ser. No. 14/139,705 entitled "Free-Standing Metallic Article With Overplating" and filed on Dec. 23, 2013; which is owned by the assignee of the present disclosure and is hereby incorporated by reference. Yet further metallic articles may incorporate expansion segments, as disclosed in U.S. patent application Ser. No. 14/079,544 entitled "Free-Standing Metallic Article With Expansion Segment" and filed on Nov. 13, 2013; which is owned by the assignee of the present disclosure and is hereby incorporated by reference.

Figure 4A:
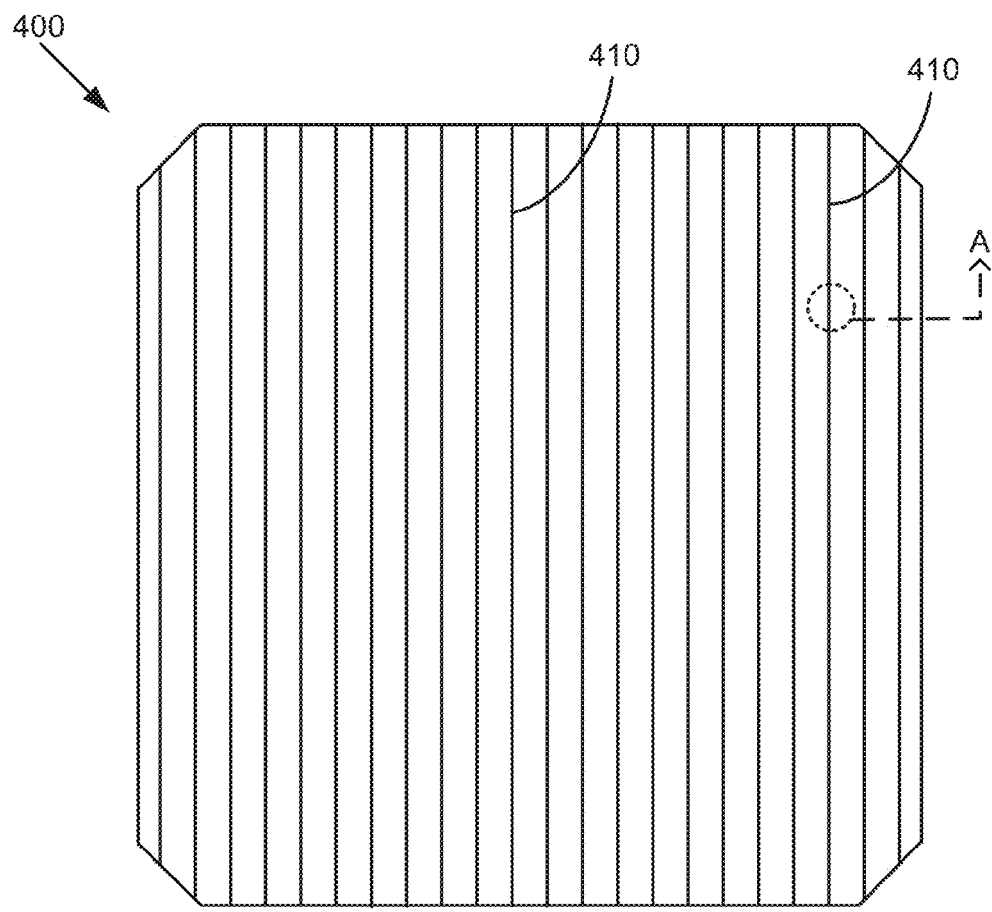
FIGS. 4A-4B show a top view and cross-sectional view, respectively, of silver patterns for use with a metallic article, in one embodiment.

Silver patterns having a reduced amount of silver compared to conventional cells will now be described. FIG. 4A provides a top view a semiconductor substrate 400 having a top surface 401 (FIG. 4B) with silver patterns 410 that may be used with the free-standing metallic articles described above. The silver patterns 410 in the embodiment of FIG. 4A are fingers that extend across the entire length of substrate 400. A free-standing metallic article, such as article 200 of FIG. 2 or article 300 of FIG. 3, will be overlaid on and coupled to silver fingers 410, such as by soldering. The metallic article serves as the major current-carrying component for semiconductor substrate 400, rather than the silver fingers 410, and therefore the silver fingers 410 can be significantly reduced in dimension. Additionally, no silver bus bars are needed, which further reduces the amount of silver. Instead, the metallic article provides the bus bars. Because the metallic article can be tailored with dimensions that are not achievable for screen-printed silver fingers bus bars, and can be fabricated from a less costly material such as copper, a photovoltaic cell fabricated with the silver finger design of FIG. 4 and the free-standing metallic articles described herein has an improved efficiency and cost compared to conventional silver-metallized cells.

Figure 4B:
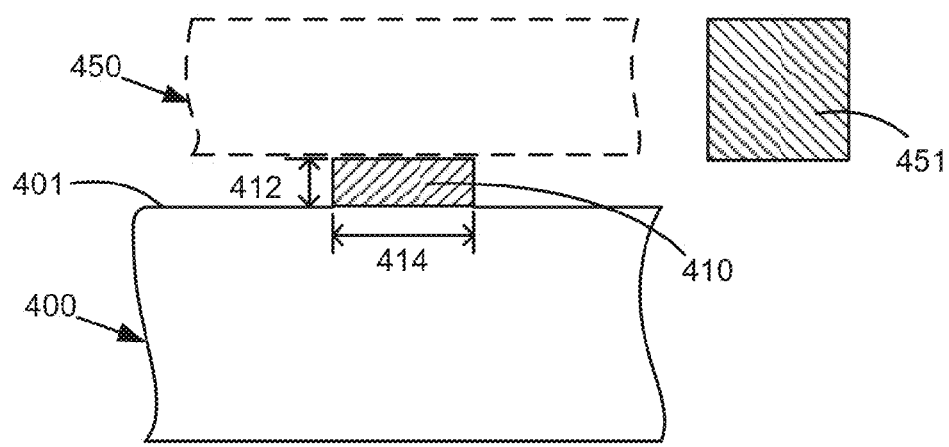

FIG. 4B shows an exemplary cross-section of a silver finger 410, taken at section A of FIG. 4A. Silver finger 410 has a thickness 412 and a width 414, where the thickness 412 is a height perpendicular to the top surface 401 of semiconductor substrate 400. The width 414 is parallel to the surface 401 of semiconductor substrate 400 and transverse to the longitudinal path of finger 410. A partial section of a metallic article 450 coupled to silver finger 410 is also shown in dashed lines, where metallic article 450 intersects finger 410 transversely in this embodiment. Metallic article 450 may be, for example, a bus bar, such as bus bar 210 FIG. 2 which would couple finger 410 to cell interconnect 240. Silver finger 410 collects current from a localized area of semiconductor substrate 400, such as half the distance between the neighboring silver fingers 410. Silver finger 410 also provides a contact area for bonding metallic article 450 to semiconductor substrate 400. Metallic article 450 is the major current-carrying component for the cell rather than fingers 410, with the metallic article 450 gathering the local current from fingers 410 and carrying the electrical current globally for the cell. Consequently, both the thickness 412 and width 414 of silver finger 410 can be reduced or minimized as desired since the cross-sectional area defined by thickness 412 and width 414 of silver finger 410 does not need to meet the current density requirement of the overall cell. In contrast, conventional cells must maintain a fixed amount of silver cross-sectional area to meet current density requirements, such that if the width of a conventional silver finger is reduced, then the thickness must be increased. In some embodiments of FIG. 4B the thickness 412 of finger 410 may be, for example, 50 µm or less with a width 414 of 125 µm or less. In further embodiments, finger 410 may have a thickness 412 of 15 µm or less with a width 414 of 60 µm or less. In yet other embodiments the thickness 412 can be manufactured as thin as possible, within the limits of screen-printing technologies.

FIG. 4B also shows an electroformed cross-sectional area 451 of the metallic article 450. The combination of the segment cross-sectional area 410 plus the electroformed cross-sectional area 451 equals a total conduit cross-sectional area, the total area being designed to accommodate the total current capacity for the cell. In some embodiments, the electroformed cross-sectional area 451 forms a majority of the total conduit cross-sectional area, thus being the primary electrical conduit for the cell. As a result, it can also be seen that silver usage is reduced compared to using silver for both the fingers and bus bars of a solar cell.

Table 1 shows exemplary reductions in the amount of silver for three embodiments A, B and C modeled for the front surface of a photovoltaic cell, compared to a conventional cell.

TABLE 1

Exemplary silver finger dimensions

| Cell | Silver Fingers (front) width (µm) | Silver Fingers (front) height (µm) | Cross Section Ag (µm²) | Ag Reduction % | Bus bars # | Cell Efficiency % |
|---|---|---|---|---|---|---|
| Conventional | 80 | 20 | 1600 | n/a | 3 | 17.71 |
| A | 50 | 10 | 500 | 77% | 20 | 18.44 |
| B | 40 | 10 | 400 | 84% | 20 | 18.54 |
| C | 30 | 10 | 300 | 92% | 20 | 18.62 |

As can be seen from Table 1, embodiments A, B and C utilize a metallic article having twenty bus bars (e.g., copper) compared to three silver bus bars in the conventional cell. The bus bars in cells A, B and C serve as the primary electrical conduits for distributed current collection, enabling the silver fingers—which collect current to be gathered by the bus bars—to be decreased in size. As can be seen, both the width and height of the silver fingers in embodiments A, B and C are reduced compared to the conventional cell. For example, embodiment A has a width of 50 μm and a height of 10 μm, whereas the conventional cell has a width of 80 μm and a height of 20 μm. Note that the heights listed in Table 1 are average heights. The silver fingers of cells A, B and C have cross-sectional areas of 300-500 μm² compared to 1600 μm² for the conventional cell, which is a significant reduction in silver. Converting the cross-sectional area to a corresponding weight of silver required for the front side of the cell, the reductions in milligrams of silver (Ag reduction) compared to the conventional cell are 77% for embodiment A, 84% for embodiment B, and 92% for embodiment C. Cross-sectional areas for the silver fingers may be configured with different values from those listed in Table 1, such as having silver segment cross-sectional areas of less than or equal to 800 um² in other embodiments.

Figure 5:
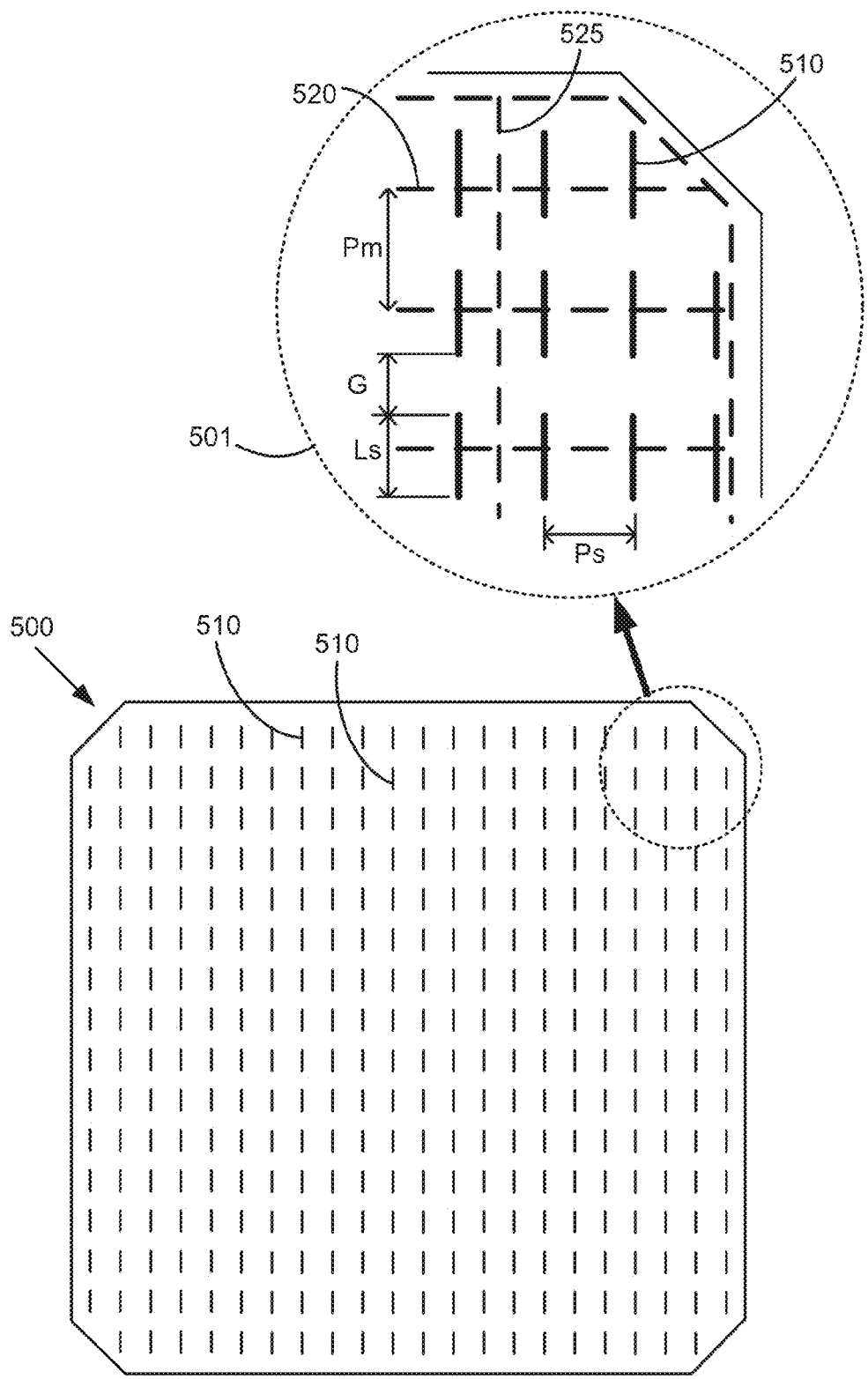
FIG. 5 provides a top view, with a detailed inset, of segmented silver patterns for use with a metallic article in another embodiment.

FIG. 5 is a top view of another embodiment of a semiconductor substrate 500 for a photovoltaic cell, in which the silver patterns are segments 510 arranged in a discontinuous linear arrangement. That is, segments 510 have a reduced length compared to the continuous silver fingers of FIG. 4A, with gaps between segments 510. Thus, the amount of silver that is used is further reduced compared to continuous lines across the entire length of a solar cell. Inset 501 provides a detailed view of a portion of the substrate 500, with an exemplary metallic article shown in dashed lines. The metallic article is coupled to the substrate 500 in the fabrication of a solar cell. The metallic article has gridlines that include bus bars 520 which intersect silver segments 510, and also has support members 525 which are generally parallel to silver segments 510 in this embodiment. The silver segments 510 are laterally spaced apart at a pitch $P_S$, while the metal bus bars 520 are spaced at a pitch $P_M$. Because the metallic article carries the majority of the current for the photovoltaic cell, the silver segments 510 only need to carry current through a distance to the nearest gridline; that is, bus bar 520 or support member 525. In some embodiments, the bus bars 520 are configured to be the main electrical conduit for the metallic article while the support members 525 provide mechanical support and a portion of the electrical connection. For example, bus bars 520 may be configured to provide a path directly to the cell's interconnections (e.g. 230 and 240 of FIG. 2) or may have a greater cross-sectional area than support members 525.

Using the bus bars as the main carrying component, the silver segments 510 may have a length $L_S$ expressed as $$L_S = P_M - k \cdot P_S / 2 \quad (1)$$

where $P_M$ is the pitch of the metallic bus bars 520 that intersect the segments 510; $P_S$ is the pitch of the segments 510, and k is a value from 1.0 and 1.4. The factor 'k' may be based on a junction sheet resistivity of the semiconductor substrate. For example, in some embodiments a junction sheet resistivity is approximately 75 ohms/square, and k is 1.2. For lower junction sheet resistances, k can be adjusted, with k being inversely proportional to the sheet resistance. The discontinuous segments 510 have a gap 'G' between the ends of the segments 510, along the line on which they are arranged. The gap G may be at least partially determined by, for instance, the pitch $P_M$, such that the segment lengths $L_S$ are spaced to intersect with bus bars 520. In various embodiments, the gap may be less than or equal to 1.5 mm. Table 2 lists sample embodiments of silver segment lengths Ls for a gap of 1.0 mm.

TABLE 2

Exemplary component dimensions for segment gap G = 1.0 mm

| Cell | Bus bar pitch $P_m$ (mm) | Bus bar width (μm) | Silver segment length Ls (mm) | Ag reduction |
|---|---|---|---|---|
| 1 | 5-12 | 200-450 | 2-5 | ~60% |
| 2 | 3-5 | 100-250 | 1-2 | ~70% |
| 3 | 1.5-3 | 50-150 | 0.25-1 | ~90% |

Table 2 describes three types of cells, with cell 3 having a metallic article with a higher number of (i.e., smaller pitch) and finer bus bars (i.e., lower width) compared to cell 1. Cell 2 has intermediate dimensions compared to cell 1 and cell 3. As can be seen from Table 2, as the number of bus bars increases, the silver segment length decreases, resulting in further amounts of silver reduction. In some embodiments, the metallic article for the solar cell may have at least ten bus bars. The component dimensions chosen for a cell design will depend on the specific application, such as type 1 being a replacement for conventional cells, type 2 being for lower active area losses and back passivation, and type 3 being high efficiency cells such as ICB and HIT designs.

Figure 6:
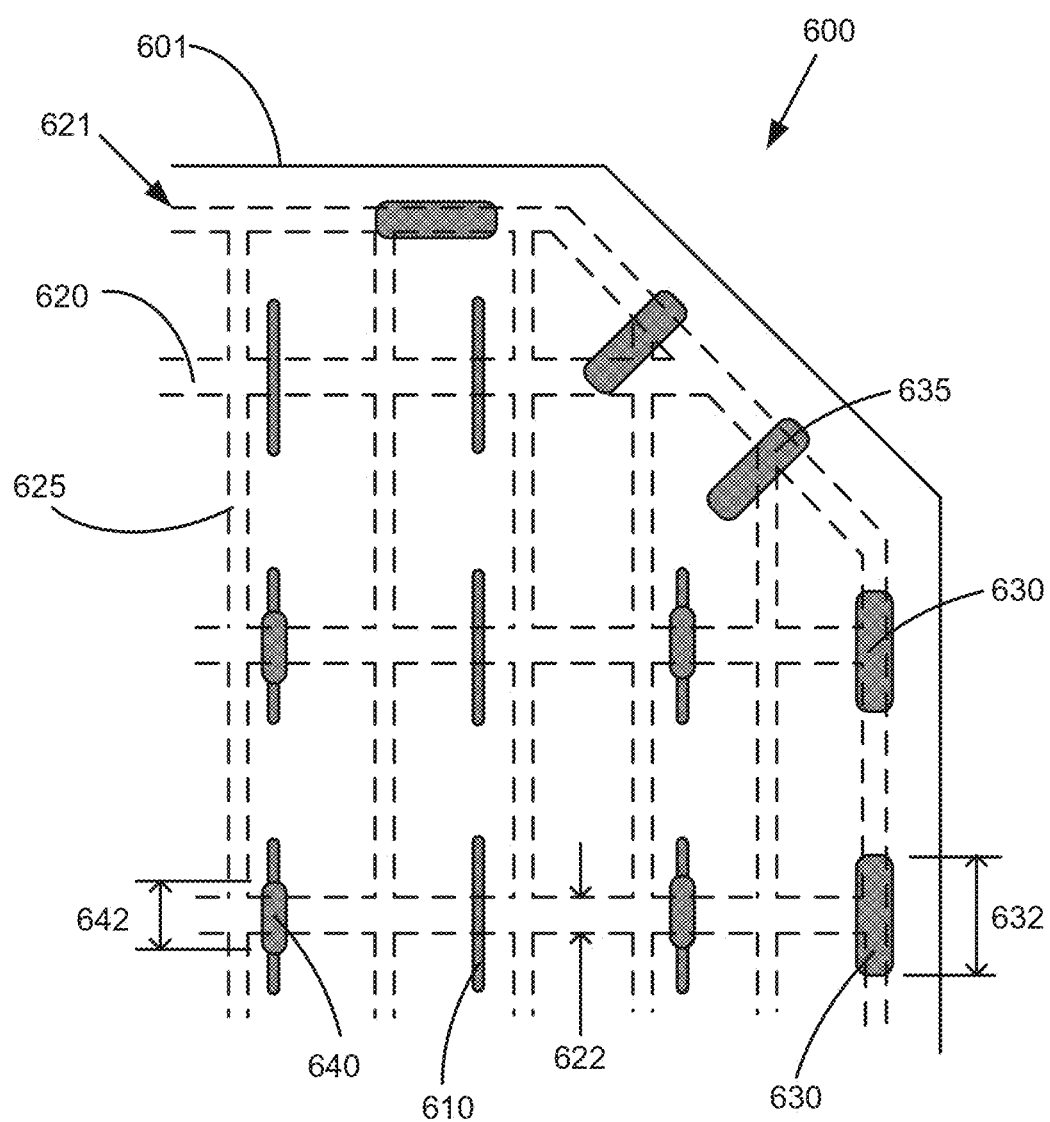
FIG. 6 shows a top view of a photovoltaic cell with exemplary silver patterns having solder pads.

FIG. 6 illustrates another embodiment in which a silver pattern design may be designed to optimize bonding areas for joining a metallic article to a solar cell. FIG. 6 shows a corner section of a photovoltaic cell 600, in which the cell 600 includes a semiconductor substrate 601, a metallic article 621, and various silver patterns. Metallic article 621 includes bus bars 620 and support members 625, as described in previous embodiments. The silver patterns include segments 610 as described previously, and also include edge solder pads 630, corner solder pads 635, and center solder pads 640. The edge solder pads 630 are positioned on semiconductor substrate 601 to be coupled to a perimeter of the metallic article 621, while center solder pads 640 are positioned to be coupled to the metallic article away from the perimeter.

Edge solder pads 630 and center solder pads 640 each provide a bond area for soldering the metallic article to the semiconductor substrate 601. Edge solder pads 630 have a length 632 while and center solder pads 640 have a length 642. To achieve sufficient bond strengths between the metallic article and semiconductor substrate 601, the lengths 632 and 642 may be at least 200 μm greater than the width 622 of electroformed bus bar 620, in some embodiments. This amount of bond length relative to the width of the electroformed element was determined, in studies done in relation to the present disclosure, to be important in providing sufficient bond strengths. Having a bond length 632/642 of at least 200 μm greater than the width 622 of electroformed element 622 can also provide manufacturing tolerance in placement of the metallic article 621 onto the substrate 601. FIG. 6 also shows corner bond pads 635 which are located in the corner of the pseudosquare. In this embodiment, corner bond pads 635 are coupled to the perimeter of the metallic article 621, and thus have similar dimensions as edge solder pads 630. However, corner bond pads 635 are oriented perpendicularly to the perimeter of the metallic article 621 rather than being aligned with the perimeter as edge solder pads 630 are. Having corner bond pads 635 angled as shown in FIG. 6 can assist in accommodating the various directions of stress that the bus bars 620 and support members 625 encounter in this corner region.

FIG. 6 also illustrates that the edge solder pads 630 may be configured with a larger bond area than center pads 640. Through theoretical modeling as well as actual thermal cycling and humidity testing conducted in relation to this disclosure, it was found that solder joint stress on the metallic article 621 is highest at the edges of the cell 601. Designing the solder pads to be larger near the perimeter of the cell compared to the center pads away from the perimeter provides silver material where it is needed most, while reducing the overall use of silver in the cell. In some embodiments, for example, the length 632 of edge pads 630 may be at least 300 µm, such as at least 500 µm. Length 642 of center pads 640 in some embodiments may be at least 100 µm, such as at least 125 µm. Although the center solder pads 640 are all shown to be the same size in FIG. 6, in other embodiments, the center solder pads 640 may differ in size from each other depending on the amount of joint stress that is anticipated at that particular location. For example, the joint stress between the semiconductor substrate 601 and metallic article 621 may decrease from the edge to the center of the cell 600. Accordingly, the center bond pads 640 may be designed to have a decreasing size toward the center of cell 600. Such a variation in size may enable even further reduction in silver usage, by utilizing less silver in less critical areas.

Figure 7:
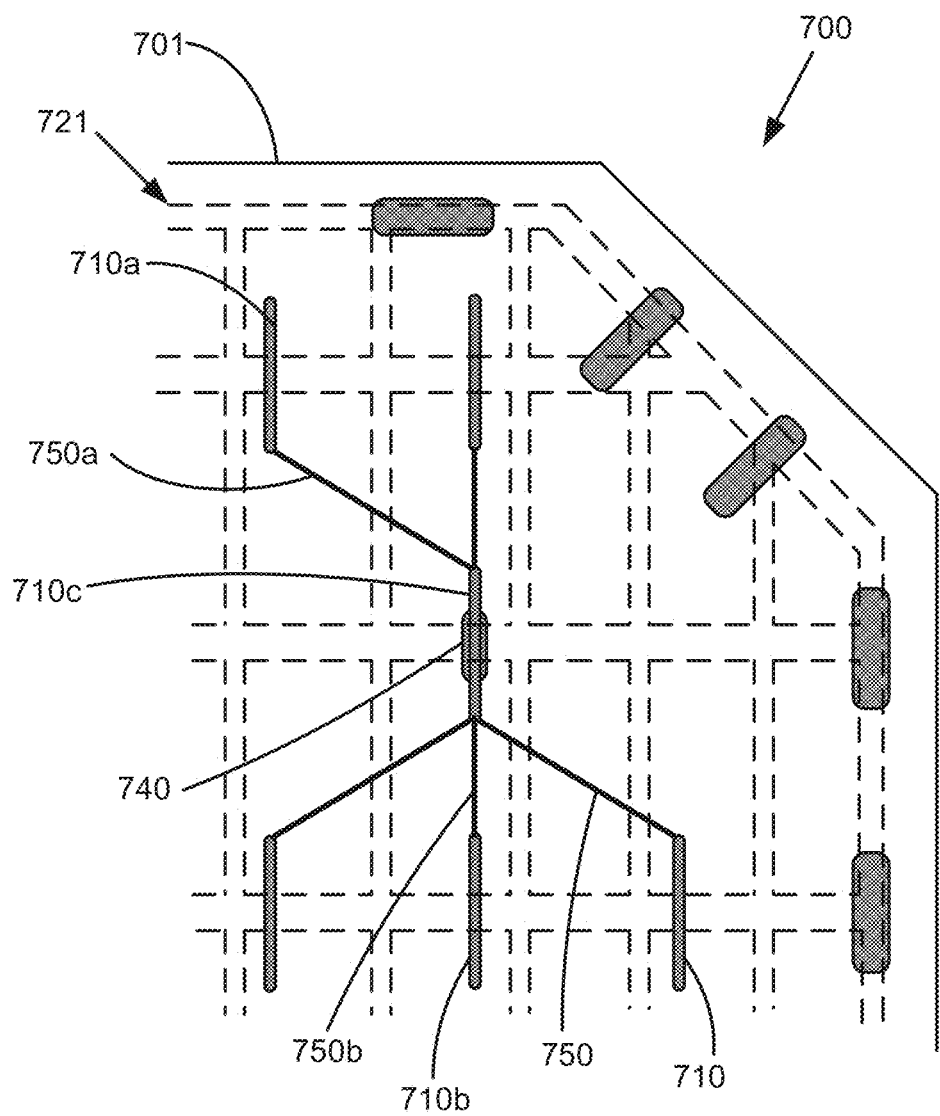
FIG. 7 is a top view of another embodiment of exemplary silver patterns having solder pads, with auxiliary silver lines.

FIG. 7 shows another embodiment of silver patterns in a cell 700, in which one solder pad used for coupling to multiple silver fingers, instead of having a solder pad for each segment as in FIG. 6. The cell 700 includes a semiconductor substrate 701 and a metallic article 721, with pattern segments 710 (including segments 710a-710c) on semiconductor substrate 701. FIG. 7 illustrates that auxiliary lines 750 (including lines 750a-750b), comprising silver, are used to couple a center solder pad 740 to multiple pattern segments 710. In this embodiment, auxiliary lines 750 form a linear path between the pattern segment 710c on which bond pad 740 is positioned, to the surrounding pattern segments 710. For example, auxiliary line 750a forms a diagonal line between an end of segment 710c to an end of segment 710a, which is horizontally and laterally offset from segment 710c. Auxiliary line 750b forms a straight line the opposite end of segment 710c to an end of segment 710b, which is longitudinally aligned with segment 710c. Auxiliary lines 750 may have a width that is narrower than pattern segments 710, to minimize the impact on shading. Using one solder bond pad for multiple silver segments may reduce active area loss (i.e., shading) compared to having one solder pad for each segment, if the surface area of the auxiliary lines is designed to be less than the area of the solder pads they are replacing. Note that although the embodiment of FIG. 7 is shown for discontinuous silver segments, auxiliary lines may be utilized with the continuous silver fingers of FIG. 4A as well. Reducing the number of solder pads 740 also decreases the number of solder joints required for coupling metallic article 721 to substrate 701, which can reduce manufacturing cost.

Note that although the embodiments described herein show intersections between bus bars and silver segments as perpendicular (e.g. between bus bars 620 and silver segments 610), in other embodiments the intersections may be at other angles. For example, the wavy configuration of expansion segments 310 in FIG. 3 may result in a non-perpendicular arrangement between bus bars and silver segments. In other examples, the gridlines of a metallic article may be laid out in non-perpendicular arrangements, such as at oblique angles to each other. Furthermore, although the embodiments herein have been shown with uniform pitches throughout the cell, in other embodiments the pitches of the bus bars and the silver fingers or lines may vary in different regions of a solar cell. In such embodiments, the calculations for pitch and segment length may reflect average values for the entire cell, or may be calculated for a specific region of the cell.

Figure 8:
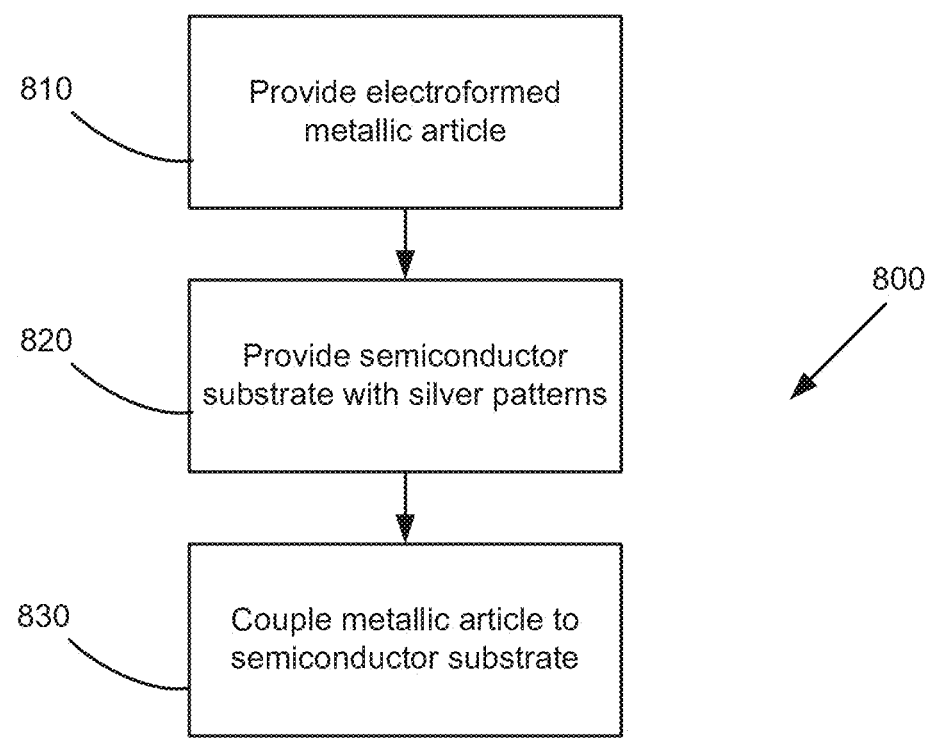
FIG. 8 is an exemplary flowchart of a method for forming a photovoltaic cell with a metallic article and semiconductor substrate with silver patterns.

FIG. 8 is an exemplary flow chart 800 of a method for forming a photovoltaic cell using the metallic articles and silver patterns described above. In step 810, an electroformed metallic article is provided, where the metallic article has a plurality of electroformed elements that form a free-standing, unitary piece. The metallic article has gridlines that are spaced apart at a pitch $P_M$. In some embodiments the gridlines include a support member and bus bars, the bus bars being spaced at the pitch $P_M$ and intersecting the support member. The bus bars electrically couple the support member to a cell interconnect, where, in some embodiments, the cell interconnect is an electroformed element of the metallic article. The metallic article may be formed on an electrically conductive mandrel having one or more preformed patterns, such as disclosed in Babayan et al., U.S. Pat. No. 8,569,096.

In step 820 a semiconductor substrate is provided, where the semiconductor substrate has a top surface with a plurality of silver patterns. In some embodiments the silver patterns extend continuously across a length of the solar cell, where the silver patterns have a cross-sectional area that is reduced compared to conventional cells. For example, both the width and thickness of the silver finger may be reduced compared to conventional cells. In other embodiments, at least one of the silver patterns includes pattern segments forming a discontinuous linear path. The pattern segments are spaced apart at a pitch $P_S$ and have a length $L_S$ as described in relation to FIG. 5, with a longitudinal gap between segments. The silver patterns may also include edge and center solder pads as described in relation to FIG. 6, where edge solder pads may have a bond area that is greater than the center solder pads.

In step 830 the metallic article is coupled to a semiconductor substrate, mechanically and electrically. Step 830 may include coupling a front grid to the front side of a semiconductor wafer, and coupling a back grid to the back side of the wafer. The coupling may be soldering, such as manual or automated soldering. The solder may be applied at specific points such as silver solder pads that have been printed onto the wafer. In some embodiments, the solder may have been pre-applied onto all or some of the metallic article, such as by plating or dipping. Pre-applied solder may then be reflowed during the coupling process of step 830. In other embodiments, the solder may be an active solder, and may enable bonding at non-metallized portions of the wafer as described in U.S. Provisional Patent Application, 61/868,436, entitled "Using an Active Solder to Couple a Metallic Article to a Photovoltaic Cell," filed on Aug. 21, 2013, owned by the assignee of the present application and incorporated by reference herein.

It can be seen that the free-standing electroformed metallic articles and silver patterns described herein are applicable to various cell types. Furthermore, the electroformed electrical conduits and silver patterns may be utilized on either the front surface or rear surface of a solar cell, or both. In addition, although the embodiments herein have primarily been described with respect to photovoltaic applications, the methods and devices may also be applied to other semiconductor applications such as redistribution layers (RDL's) or flex circuits. Furthermore, the flow chart steps may be performed in alternate sequences, and may include additional steps not shown. Although the descriptions have described for full size cells, they may also be applicable to half-size or quarter-size cells. For example, the metallic article and silver pattern design may have a layout to accommodate the cell having only one or two chamfered corners instead of all four corners being chamfered as in a mono-crystalline full pseudosquare.

While the specification has been described in detail with respect to specific embodiments of the invention, it will be appreciated that those skilled in the art, upon attaining an understanding of the foregoing, may readily conceive of alterations to, variations of, and equivalents to these embodiments. These and other modifications and variations to the present invention may be practiced by those of ordinary skill in the art, without departing from the scope of the present invention, which is more particularly set forth in the appended claims. Furthermore, those of ordinary skill in the art will appreciate that the foregoing description is by way of example only, and is not intended to limit the invention.

What is claimed is:

1. A method of forming a photovoltaic cell, the method comprising:
    providing an electroformed metallic article having a plurality of electroformed elements that form a free-standing, unitary piece comprising gridlines that are spaced apart at a pitch $P_M$;
    providing a semiconductor substrate having a top surface with a plurality of silver patterns comprising silver, wherein at least one of the silver patterns comprises pattern segments, the pattern segments being spaced apart at a pitch $P_S$ and having a length $L_S$ defined by an equation $L_S = P_M - k*P_S/2$, k being a value from 1.0 to 1.4; and
    coupling the metallic article to the semiconductor substrate, the coupling comprising coupling a first electroformed element in the plurality of electroformed elements to a first silver pattern in the plurality of silver patterns.

2. The method of claim 1 wherein the length $L_S$ is along a path intersected by one of the gridlines.

3. The method of claim 1, wherein the pattern segments are configured in a discontinuous linear arrangement.

4. The method of claim 3 wherein the discontinuous linear arrangement comprises the pattern segments having ends separated by a gap that is less than or equal to 1.5 mm.

5. The method of claim 1 wherein k is based on a junction sheet resistivity of the semiconductor substrate.

6. The method of claim 5 wherein the junction sheet resistivity is approximately 75 ohms/square, and k is 1.2.

7. The method of claim 1 wherein the gridlines comprise:
    bus bars spaced at the pitch $P_M$; and
    a support member intersecting the bus bars, wherein the bus bars electrically couple the support member to a cell interconnect.

8. The method of claim 7 wherein the cell interconnect is an electroformed element in the plurality of electroformed elements.

9. The method of claim 7 wherein the gridlines comprise at least ten bus bars.

10. The method of claim 7 wherein each bus bar has an electroformed cross-sectional area and each of the pattern segments has a segment cross-sectional area;
    wherein the electroformed cross-sectional area plus the segment cross-sectional area equals a total conduit cross-sectional area; and
    wherein the electroformed cross-sectional area comprises a majority of the total conduit cross-sectional area.

11. The method of claim 10 wherein the segment cross-sectional area is less than or equal to 800 $\mu m^2$.

12. The method of claim 10 wherein the segment cross-sectional area comprises a height less than or equal to 15 $\mu m$ and a width less than or equal to 60 $\mu m$.

13. The method of claim 10 wherein the electroformed cross-sectional area is configured for distributed current collection and the segment cross-sectional area is configured for localized current collection.

14. The method of claim 1 wherein the first silver pattern provides a first bond area for the coupling, and wherein the first silver pattern is coupled to a perimeter of the metallic article.

15. The method of claim 14 wherein the first bond area has a first bond length, the first bond length being at least 200 $\mu m$ greater than a width of the first electroformed element.

16. The method of claim 14 further comprising coupling a second electroformed element in the plurality of electroformed elements to a second silver pattern in the plurality of silver patterns, the second silver pattern providing a second bond area for the coupling, wherein the second silver pattern is away from the perimeter of the metallic article; and
    wherein the first bond area is greater than the second bond area.

17. The method of claim 16 wherein the second bond area has a second bond length, the second bond length being at least 200 $\mu m$ greater than a width of the second electroformed element.

18. The method of claim 16 further comprising a plurality of auxiliary lines coupling the second silver pattern to a plurality of the pattern segments, wherein the auxiliary lines comprise silver.

19. A photovoltaic cell comprising:
    an electroformed metallic article having a plurality of electroformed elements that form a free-standing, unitary piece comprising gridlines that are spaced apart at a pitch $P_M$; and
    a semiconductor substrate coupled to the metallic article, the semiconductor substrate having a top surface with a plurality of silver patterns comprising silver, wherein a first electroformed element in the plurality of electroformed elements is coupled to a first silver pattern in the plurality of silver patterns;
    wherein at least one of the silver patterns comprises pattern segments, the pattern segments being spaced apart at a pitch $P_S$ and having a length $L_S$ defined by an equation $L_S = P_M - k*P_S/2$, k being a value from 1.0 to 1.4.

20. The photovoltaic cell of claim 19, wherein the pattern segments are configured in a discontinuous linear arrangement.

21. The photovoltaic cell of claim 20 wherein the discontinuous linear arrangement comprises the pattern segments having ends separated by a gap that is less than or equal to 1.5 mm.

22. The photovoltaic cell of claim 19 wherein k is based on a junction sheet resistivity of the semiconductor substrate, wherein the junction sheet resistivity is approximately 75 ohms/square, and k is 1.2.

23. The photovoltaic cell of claim 19 wherein the gridlines comprise:
    bus bars spaced at the pitch $P_M$; and
    a support member intersecting the bus bars, wherein the bus bars electrically couple the support member to a cell interconnect;
    wherein each bus bar has an electroformed cross-sectional area, and each of the pattern segments has a segment cross-sectional area; wherein the electroformed cross-sectional area plus the segment cross-sectional area equals a total conduit cross-sectional area; and
    wherein the electroformed cross-sectional area comprises a majority of the total conduit cross-sectional area.

24. The photovoltaic cell of claim 23 wherein the segment cross-sectional area comprises a height less than 15 $\mu m$ and a width less than 60 $\mu m$.

25. The photovoltaic cell of claim 19 wherein the first silver pattern provides a first bond area for the coupling, and wherein the first silver pattern is coupled to a perimeter of the metallic article.

26. The photovoltaic cell of claim 25 wherein the first bond area has a first bond length, the first bond length being at least 200 μm greater than a width of the first electroformed element.

27. The photovoltaic cell of claim 25 further comprising coupling a second electroformed element in the plurality of electroformed elements to a second silver pattern in the plurality of silver patterns, the second silver pattern providing a second bond area for the coupling, wherein the second silver pattern is away from the perimeter of the metallic article; and wherein the first bond area is greater than the second bond area.

28. The photovoltaic cell of claim 27 further comprising a plurality of auxiliary lines coupling the second silver pattern to a plurality of the pattern segments, wherein the auxiliary lines comprise silver.

* * * * *